(12) United States Patent
Hsieh

(10) Patent No.: US 12,555,959 B2
(45) Date of Patent: Feb. 17, 2026

(54) CONNECTOR INCLUDING SUBSTRATE HAVING THROUGH HOLES

(71) Applicant: BIZLINK INTERNATIONAL CORP., New Taipei (TW)

(72) Inventor: Chin-An Hsieh, New Taipei (TW)

(73) Assignee: BIZLINK INTERNATIONAL CORP., New Taipei (TW)

( * ) Notice: Subject to any disclaimer, the term of this patent is extended or adjusted under 35 U.S.C. 154(b) by 503 days.

(21) Appl. No.: 18/064,279

(22) Filed: Dec. 11, 2022

(65) Prior Publication Data

US 2024/0162661 A1 May 16, 2024

(30) Foreign Application Priority Data

Nov. 15, 2022 (TW) ................................. 111143647

(51) Int. Cl.
*H01R 13/6471* (2011.01)
*H01R 12/71* (2011.01)
*H01R 13/6473* (2011.01)

(52) U.S. Cl.
CPC ....... *H01R 13/6471* (2013.01); *H01R 12/714* (2013.01); *H01R 12/716* (2013.01); *H01R 13/6473* (2013.01)

(58) Field of Classification Search
CPC ............ H01R 13/6176; H01R 13/6477; H01R 13/6471; H01R 13/6473; H05K 1/117; H05K 1/115

See application file for complete search history.

(56) References Cited

U.S. PATENT DOCUMENTS

| 6,425,766 B1 * | 7/2002 | Panella ................ H01R 12/721 439/59 |
| 9,084,353 B2 * | 7/2015 | De Geest ............... H05K 1/024 |
| 9,560,741 B2 * | 1/2017 | Rose .................... H05K 1/0251 |
| 10,231,327 B1 * | 3/2019 | Murakami ........... H05K 1/0219 |
| 2015/0340785 A1 * | 11/2015 | Kashiwakura ......... H05K 1/117 439/630 |

FOREIGN PATENT DOCUMENTS

| CN | 112118674 A | 12/2020 |
| CN | 213522493 U | 6/2021 |
| TW | I738374 B | 9/2021 |

* cited by examiner

*Primary Examiner* — Marcus E Harcum
(74) *Attorney, Agent, or Firm* — CKC & Partners Co., LLC

(57) ABSTRACT

A connector includes a first grounding terminal, a first signal terminal, a second signal terminal, a second grounding terminal, and a substrate. The first grounding terminal, the first signal terminal, the second signal terminal, and the second grounding terminal are arranged in sequence, and each of them has a contact area. The first grounding terminal, the first signal terminal, the second signal terminal, and the second grounding terminal are sequentially disposed on the substrate and are parallel to each other. The substrate has plural through holes disposed between the first signal terminal and the second signal terminal.

15 Claims, 11 Drawing Sheets

CONNECTOR INCLUDING SUBSTRATE HAVING THROUGH HOLES

CROSS-REFERENCE TO RELATED APPLICATIONS

This application claims priority to Taiwan Application Serial Number 111143647, filed Nov. 15, 2022, which is herein incorporated by reference.

BACKGROUND

Field of Invention

The present disclosure relates to a connector. More particularly, the present disclosure relates to a connector including a signal terminal and a ground terminal.

Description of Related Art

To achieve electrical connection between different electronic devices, various types of electrical connectors have existed. The electrical connectors may include the type of a wire end connector and the type of a board end connector according to disposed positions, in which the wire end connector is located at one end of a cable and is used to adapt and couple to the board end connector, while the board end connector is disposed on a printed circuit board. With the continuous advancement and innovation of the technology of various electronic products, the performance of new electronic products has been greatly improved, and the types of electrical signals tend to be more diverse and require more bandwidth. Therefore, the demand for high-speed connectors is also increasing to apply to high-speed connections.

In addition, with the development of 5G communication, artificial intelligence (AI), edge computing, and IoT devices, the frequency of signals will be higher and higher, and signal throughput will be larger and larger, so the impact of circuit contacts on signal transmission will also become more and more pronounced. However, the impedance of the male-female adaptation area of a conventional connector is usually low, and the open stub of the connector that reserves an excessively long contact area causes a low impedance point, which is an inconvenient factor for the quality of signal transmission.

SUMMARY

In view of this, one object of the present disclosure is to provide a connector that can solve the above problems In order to achieve the aforementioned purpose, according to some embodiments of the present disclosure, a connector includes a first grounding terminal, a first signal terminal, a second signal terminal, a second grounding terminal, and a substrate. The first grounding terminal, the first signal terminal, the second signal terminal, and the second grounding terminal are arranged in sequence, and each of them has a contact area. The first grounding terminal, the first signal terminal, the second signal terminal, and the second grounding terminal are sequentially disposed on the substrate and are parallel to each other. The substrate has plural through holes disposed between the first signal terminal and the second signal terminal.

In some embodiments, the through holes are disposed between the contact area of the first signal terminal and the contact area of the second signal terminal.

According to some embodiments of the present disclosure, a connector includes a first grounding terminal, a first signal terminal, a second signal terminal, a second grounding terminal, and a substrate. Each of the first grounding terminal, the first signal terminal, the second signal terminal, and the second grounding terminal has a contact area. The first grounding terminal, the first signal terminal, the second signal terminal, and the second grounding terminal are sequentially disposed on the substrate and are parallel to each other, and the substrate has a plurality of through holes disposed between the first signal terminal and the first grounding terminal.

In some embodiments, the through holes of the substrate are disposed between the contact area of the first signal terminal and the contact area of the first grounding terminal.

In some embodiments, the substrate not only has the through holes disposed between the first signal terminal and the first grounding terminal, but also has a plurality of through holes disposed between the first signal terminal and the second signal terminal and between the second signal terminal and the second grounding terminal, such that all of the through holes are arranged in three columns.

In some embodiments, the first signal terminal includes an open groove through the first signal terminal to expose the substrate.

In some embodiments, the open groove extends from an end of the first signal terminal to the contact area, such the first signal terminal presents a fork shape.

In some embodiments, a width of the open groove of the first signal terminal is 25% to 99% of the maximum width of the contact area of the first signal terminal.

In some embodiments, the substrate below the open groove has no through hole.

In some embodiments, the connector is a wire end connector, and an end of the first signal terminal and an end of the second signal terminal are welded with a cable.

In summary, in the aforementioned embodiments of the present disclosure, because the substrate of the connector may have the through holes disposed between the contact area of the first signal terminal and the contact area of the second signal terminal, and may have the through holes disposed between the contact area of the first signal terminal and the contact area of the first grounding terminal, when the signal terminal and the grounding terminal of the connector are in electrical contact with the corresponding terminals of another connector, environmental equivalent dielectric constant is effectively reduced, and the characteristic impedance of the contact area can be improved to prevent the open stub of the connector from causing a low impedance point, which is beneficial for the quality of signal transmission.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
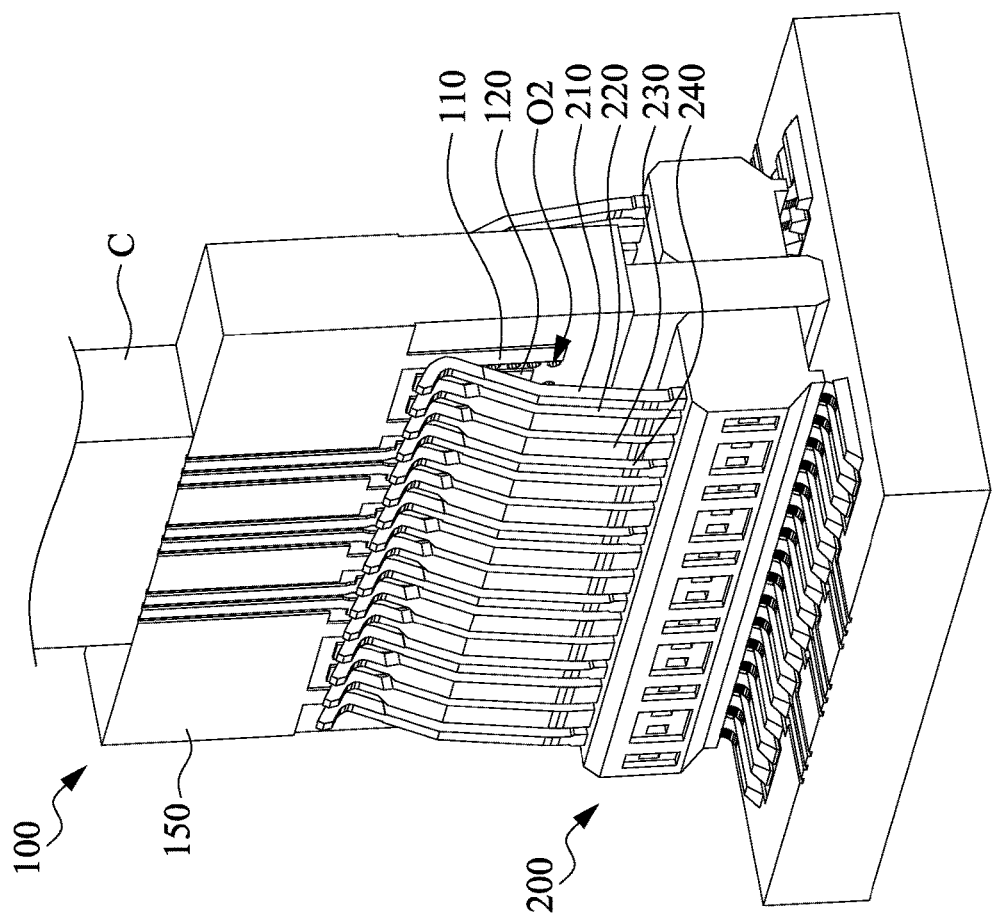
FIG. 1 is a perspective view of a connector in electrical contact with a butt connector according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
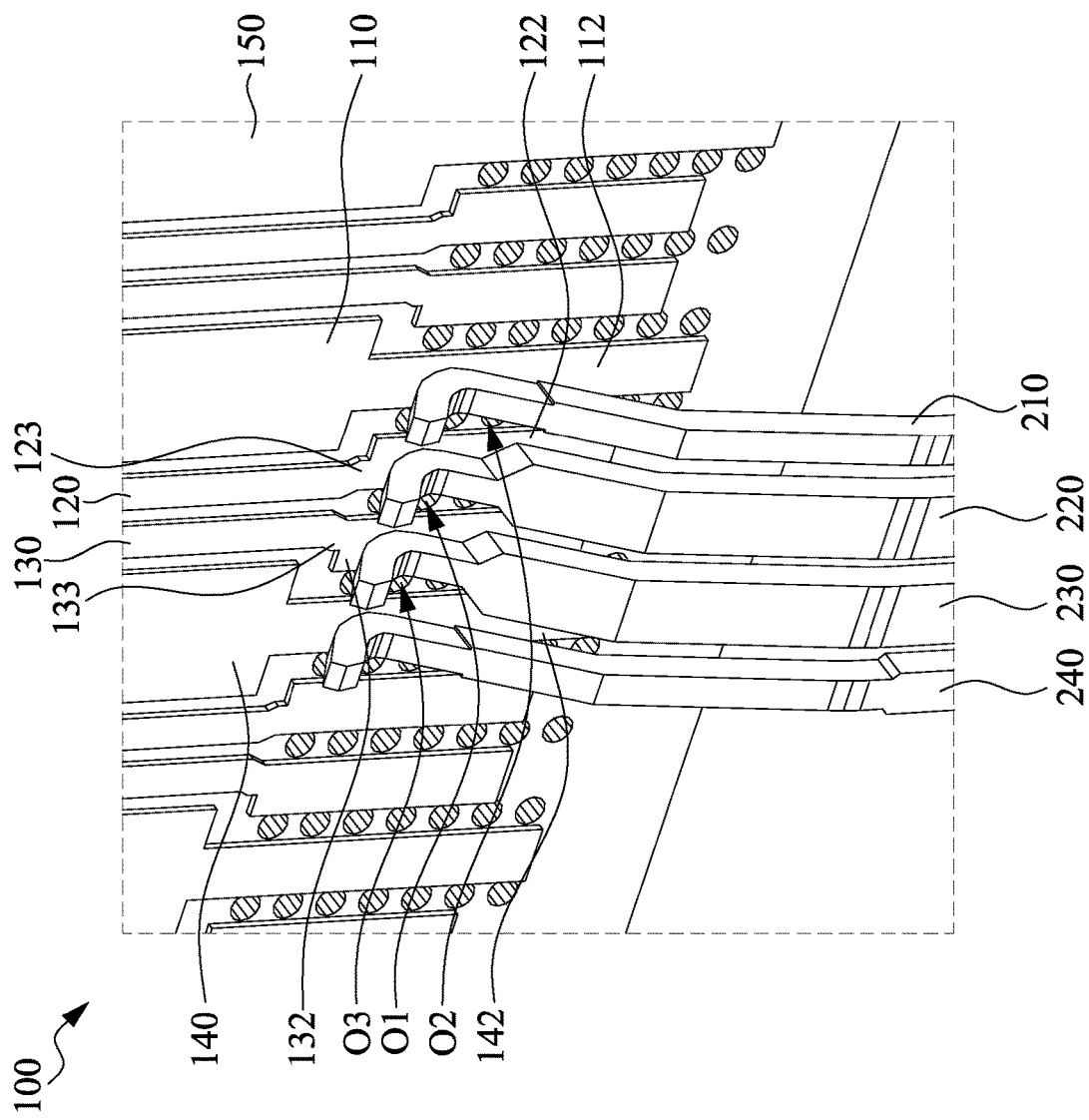
FIG. 2 is a partially enlarged view of the connector in electrical contact with the butt connector shown in FIG. 1.

FIG. 1 is a perspective view of a connector 100 in electrical contact with a butt connector 200 according to one embodiment of the present disclosure. FIG. 2 is a partially enlarged view of the connector 100 in electrical contact with the butt connector 200 shown in FIG. 1. As shown in FIG. 1 and FIG. 2, the connector 100 includes a first grounding terminal 110, a first signal terminal 120, a second signal terminal 130, a second grounding terminal 140, and a substrate 150. The first grounding terminal 110 is an elongated conductive metal for grounding. The first signal terminal 120 is an elongated conductive metal for transmitting signals, and is a signal pin. The second signal terminal 130 is an elongated conductive metal for transmitting signals, and is a signal pin. The first grounding terminal 110, the first signal terminal 120, the second signal terminal 130, and the second grounding terminal 140 may be non-elastic terminals, and the material of them may be copper, but the present disclosure is not limited in this regard. In this embodiment, the first signal terminal 120 and the second signal terminal 130 can achieve differential signal transmission, and are a pair of differential signal terminals, which is beneficial to reduce the impact of electrical noise environment. The second grounding terminal 140 is similar to the first grounding terminal 110, is an elongated conductive metal for grounding, and is a grounding pin.

The substrate 150 is a printed circuit board (PCB) or molded carrier base, for example. In this embodiment, the substrate 150 is a printed circuit board capable of electrically connecting a cable C. The connector 100 may be a wire end connector. For example, the connector 100 may be a Gen-Z wire end connector, which may apply to high-speed and high-frequency connections, such as a wire end connector for connecting a server. In addition, the butt connector 200 may be a board connector, such as the board connector of a server. The butt connector 200 may have grounding terminals 210 and 240 and signal terminals 220 and 230, and the grounding terminals 210 and 240 and the signal terminals 220 and 230 may be elongated conductive metal.

The first grounding terminal 110, the first signal terminal 120, the second signal terminal 130, and the second grounding terminal 140 are arranged in sequence, and the first grounding terminal 110 has a contact area 112, the first signal terminal 120 has a contact area 122, the second signal terminal 130 has a contact area 132, and the second grounding terminal 140 has a contact area 142. The aforementioned contact areas 112, 122, 132, and 142 are used to rub/contact corresponding terminals of another external connecter.

Moreover, the first grounding terminal 110, the first signal terminal 120, the second signal terminal 130, and the second grounding terminal 140 are sequentially disposed on the substrate 150 and are parallel to each other. In some embodiments, the substrate 150 has plural through holes O1 disposed between the contact area 122 of the first signal terminal 120 and the contact area 132 of the second signal terminal 130. In some embodiments, the substrate 150 has plural through holes O2 disposed between the contact area 122 of the first signal terminal 120 and the contact area 112 of the first grounding terminal 110. At least one of the through holes O1 and O2 may be disposed in the substrate 150. In addition, the through holes O1 and O2 of the substrate 150 are non-plating through holes (NPTHs).

Specifically, because the substrate 150 of the connector 100 may have the through holes O1 disposed between the contact area 122 of the first signal terminal 120 and the contact area 132 of the second signal terminal 130, and may have the through holes O2 disposed between the contact area 122 of the first signal terminal 120 and the contact area 112 of the first grounding terminal 110, when the signal terminal and the grounding terminal (e.g., the first and second signal terminals 120 and 130 and the first grounding terminal 110) of the connector 100 are in electrical contact with the corresponding terminals (e.g., the signal terminals 220 and 230 and the grounding terminal 210) of another connector (e.g., the butt connector 200), environmental equivalent dielectric constant can be effectively reduced, and the characteristic impedance of the contact areas 112, 122, and 132 can be improved to prevent the open stub of the connector 100 from causing a low impedance point, which is beneficial for the quality of signal transmission (will be explained from FIGS. 4 to 7).

In some embodiments, the same side ends of the first grounding terminal 110, the first signal terminal 120, the second signal terminal 130, and the second grounding terminal 140 respectively distal to the contact areas 112, 122, 132, and 142 are electrically conned to the cable C (e.g., by welding), thereby transmitting signals through the cable C.

Furthermore, the substrate 150 further has plural through holes O3 disposed between the contact area 132 of the second signal terminal 130 and the contact area 142 of the second grounding terminal 140. The through holes O3 of the substrate 150 are similar to the aforementioned through holes O1 and O2, and are non-plating through holes (NPTHs), thereby further reducing environmental equivalent dielectric constant and improving the characteristic impedance of the contact areas 132 and 142.

Figure 3:
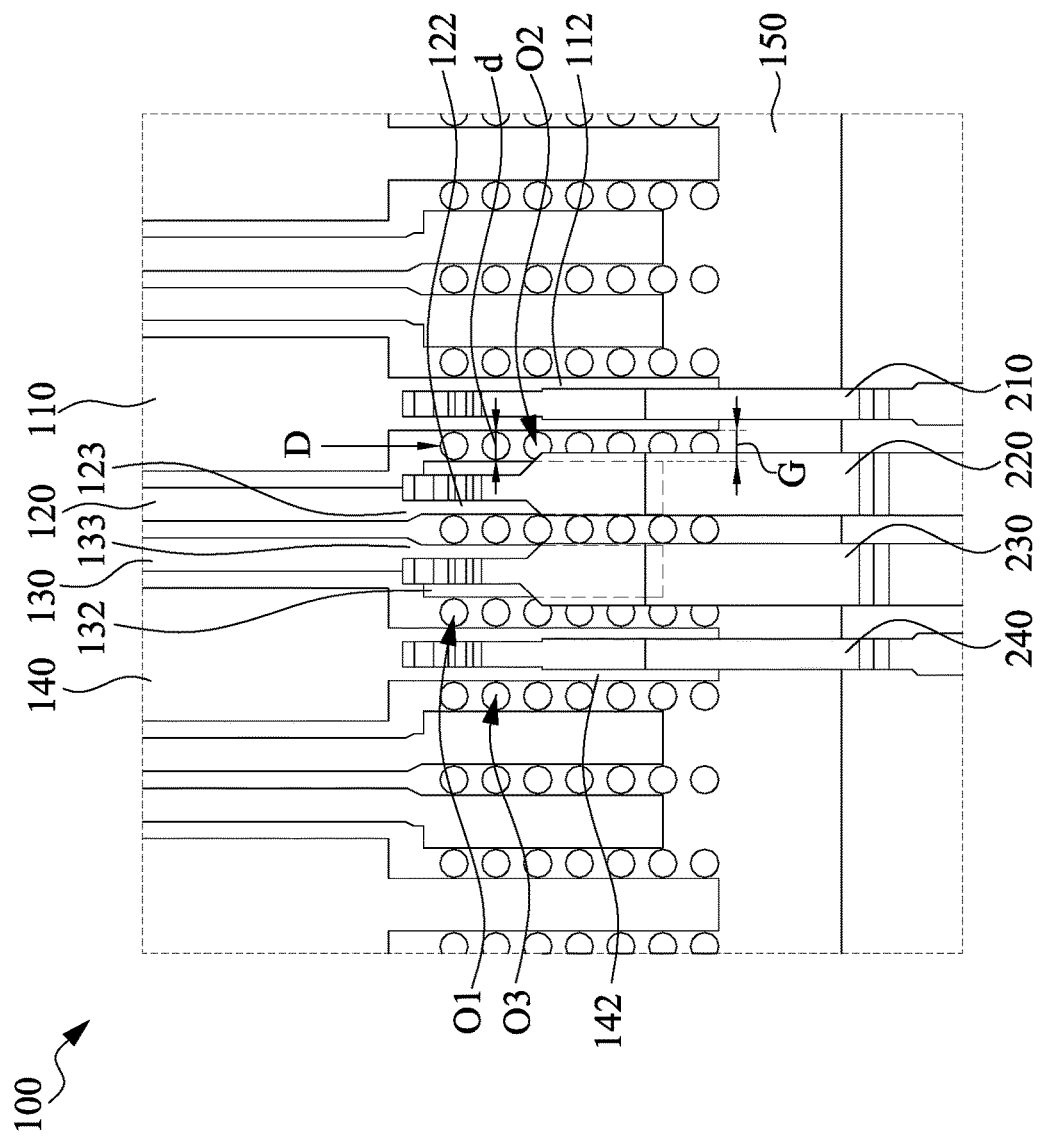
FIG. 3 is a side view of the connector in electrical contact with the butt connector shown in FIG. 2.

FIG. 3 is a side view of the connector 100 in electrical contact with the butt connector 200 shown in FIG. 2. As shown in FIG. 3, along a lengthwise direction D of the contact area 122 of the first signal terminal 120, the through holes O1 are arranged in a single column, the through holes O2 are arranged in a single column, and the through holes O3 are arranged in a single column. In other words, all of the through holes O1, O2, and O3 are arranged in three columns, respectively. The ratio of a diameter d of each of the through holes O1, O2, and O3 of the substrate 150 to a gap width G between the contact area 122 of the first signal terminal 120 and another terminal adjacent to the first signal terminal 120 is in the range from 50% to 99% (the gap width G between two adjacent terminals at the contact area 122 is greater than the diameter d). Such a configuration can prevent the connector 100 from forming low impedance points at the contact areas 112, 122, 132, and 142, which is helpful for the quality of signal transmission.

In this embodiment, the first signal terminal 120 has a turning area 123, and the second signal terminal 130 has a turning area 133. The turning area 123 of the first signal terminal 120 and the turning area 133 of the second signal terminal 130 are gradually close to each other respectively from the contact area 122 of the first signal terminal 120 and the contact area 132 of the second signal terminal 130, and are arranged to form a convergent shape, as shown in FIG. 3. The design of the necking and convergent turning areas 123 and 133 takes advantage of the circuit layout of the substrate 150. For example, the first signal terminal 120 and the second signal terminal 130 can be disposed more densely.

Figure 4:
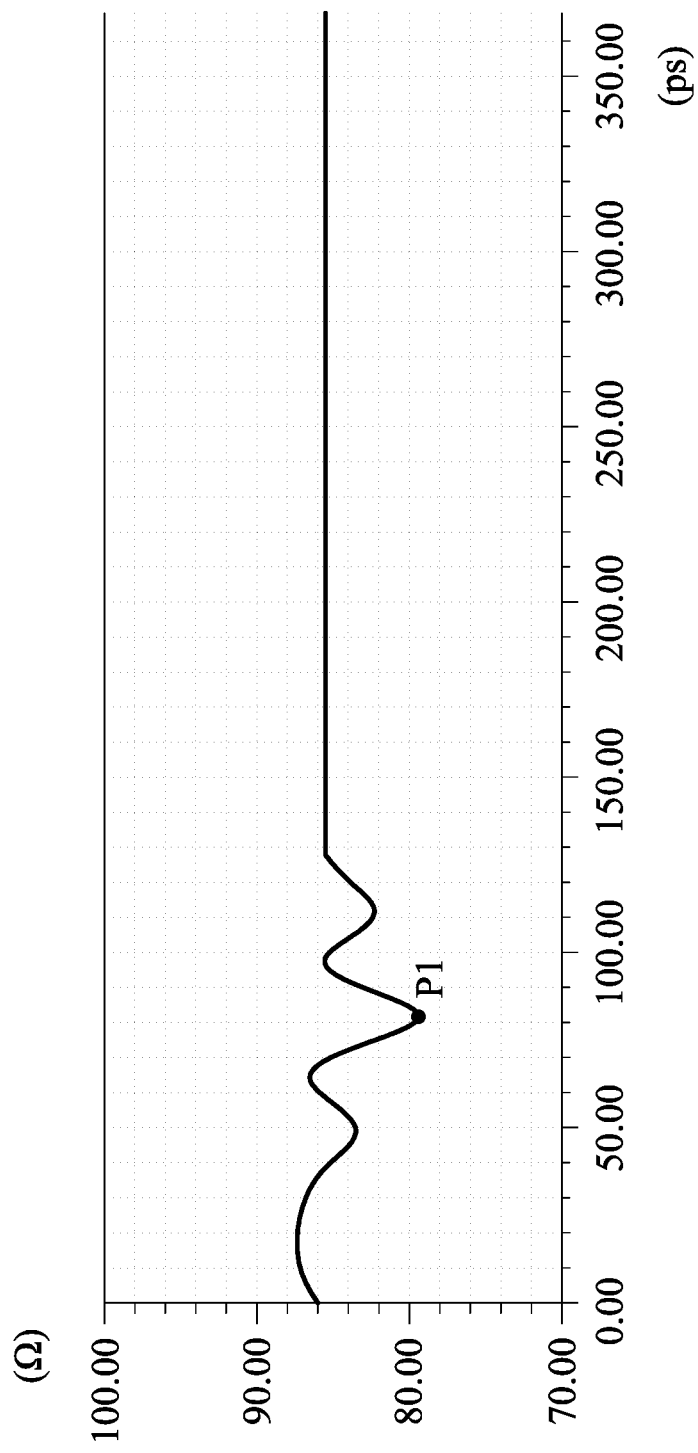
FIG. 4 is an impedance-time graph of measuring the connector of FIG. 3.
Figure 5:
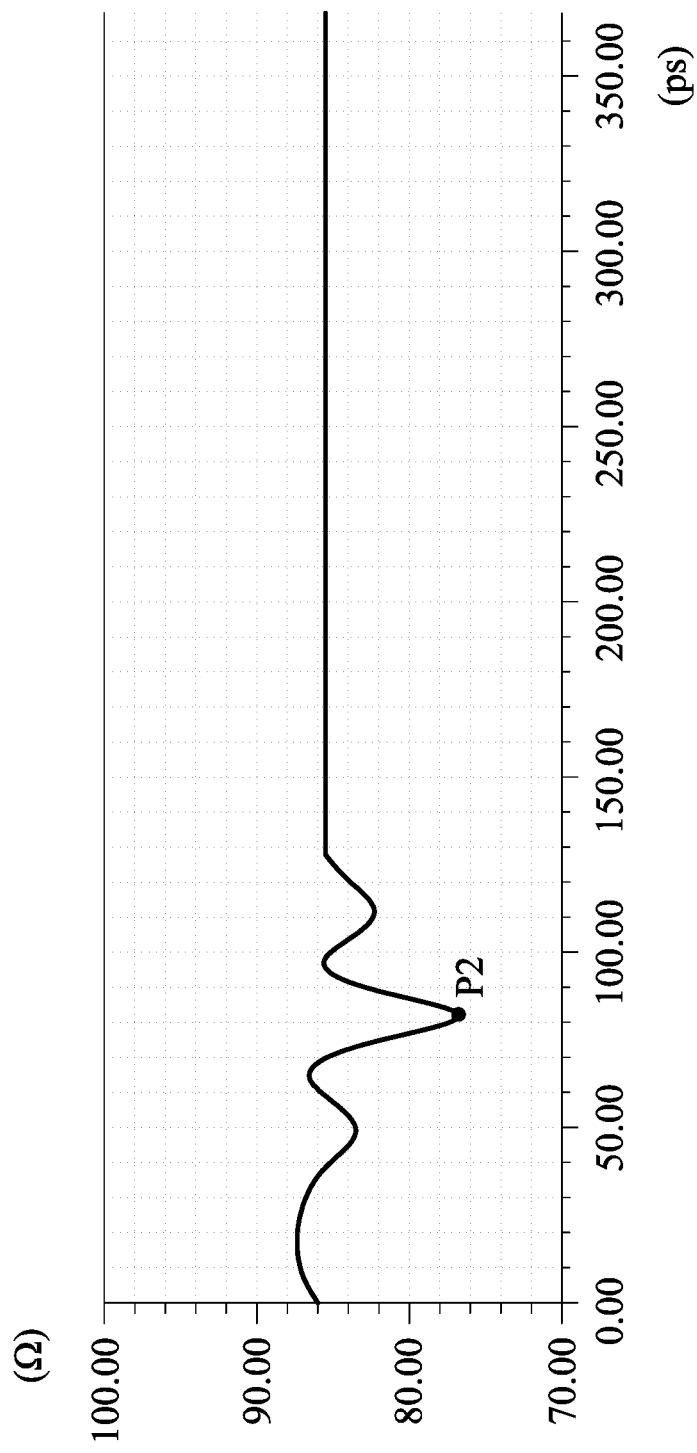
FIG. 5 is an impedance-time graph of measuring a traditional connector.

FIG. 4 is an impedance-time graph of measuring the connector 100 of FIG. 3. FIG. 5 is an impedance-time graph of measuring a traditional connector. As shown in FIG. 4 and FIG. 5, the low impedance point (i.e., a data point P1) of the contact area (e.g., the contact area 122 of the first signal terminal 120 of FIG. 3) of the connector 100 (see FIG. 3) having the through holes O1, O2, and O3 is about 79Ω, while the low impedance point (i.e., a data point P2) of the traditional connector is about 76Ω. Accordingly, the connector 100 can effectively increase the characteristic impedance of the contact area, which is beneficial for the quality of signal transmission.

Figure 6:
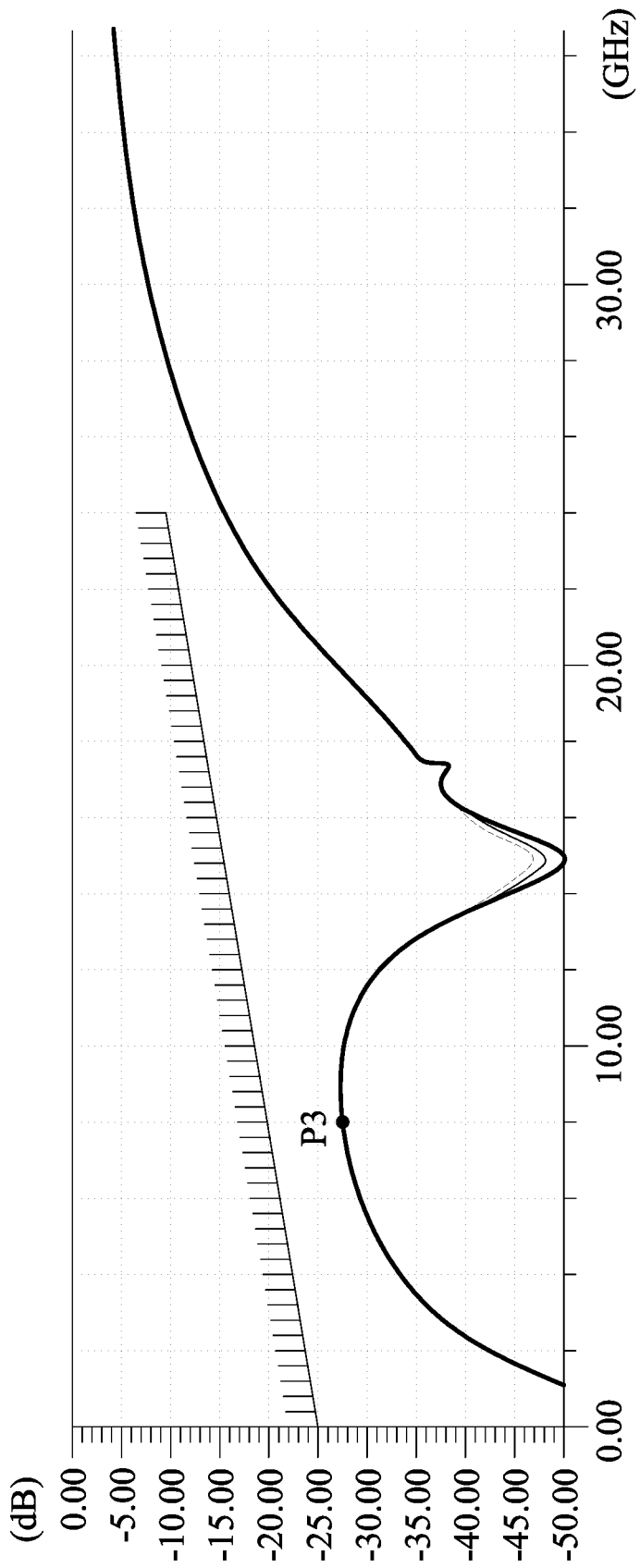
FIG. 6 is a reflection loss-frequency graph of measuring the connector of FIG. 3.
Figure 7:
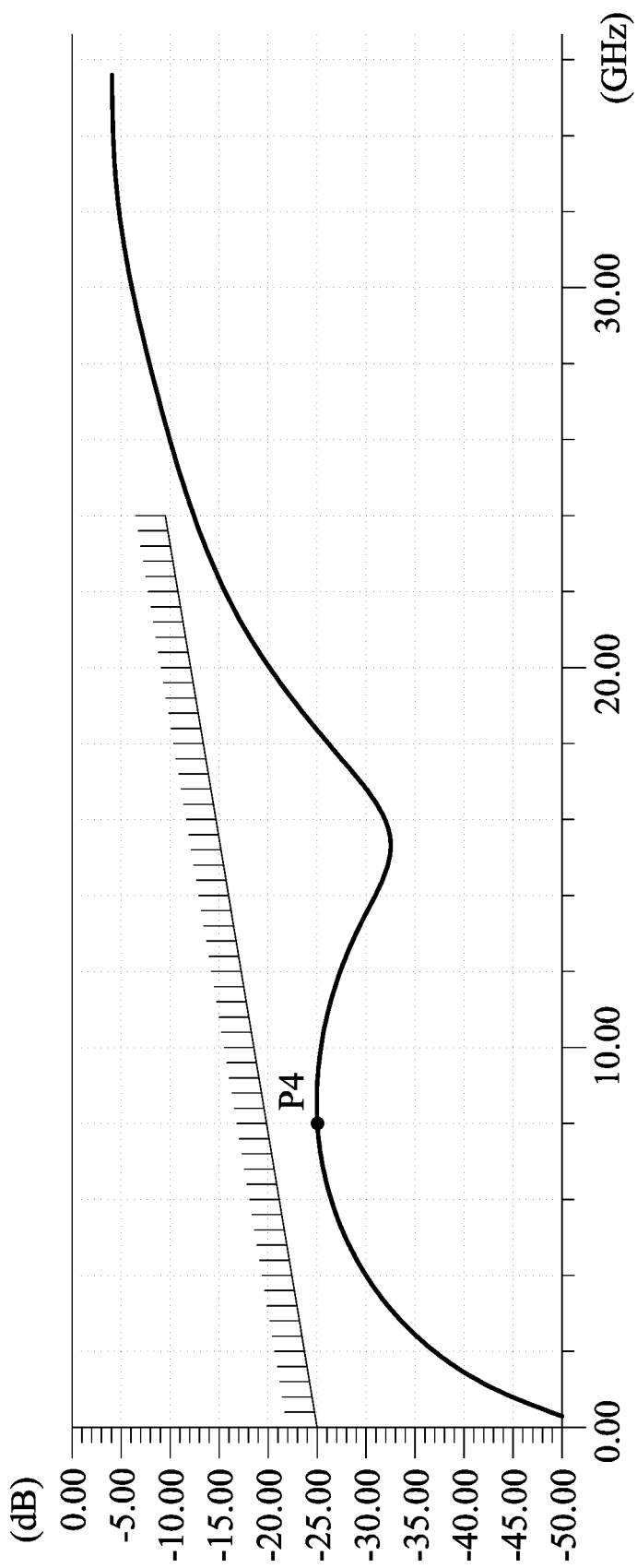
FIG. 7 is a reflection loss-frequency graph of measuring a traditional connector.

FIG. 6 is a reflection loss (dB)-frequency graph of measuring the connector 100 of FIG. 3. FIG. 7 is a reflection loss (dB)-frequency graph of measuring a traditional connector. As shown in FIG. 6 and FIG. 7, the high reflection loss (dB) point (i.e., a data point P3) of the contact area (e.g., the contact area 122 of the first signal terminal 120 of FIG. 3) of the connector 100 (see FIG. 3) having the through holes O1, O2, and O3 is about −28 dB, while the high reflection loss (dB) point (i.e., a data point P4) of traditional connector is about −26 dB. Accordingly, the connector 100 can effectively increase the sensitivity of signals, which is beneficial for the quality of signal transmission.

It is to be noted that the connection relationships, the materials, and the advantages of the elements described above will not be repeated in the following description. In the following description, other types of the connectors will be explained.

Figure 8:
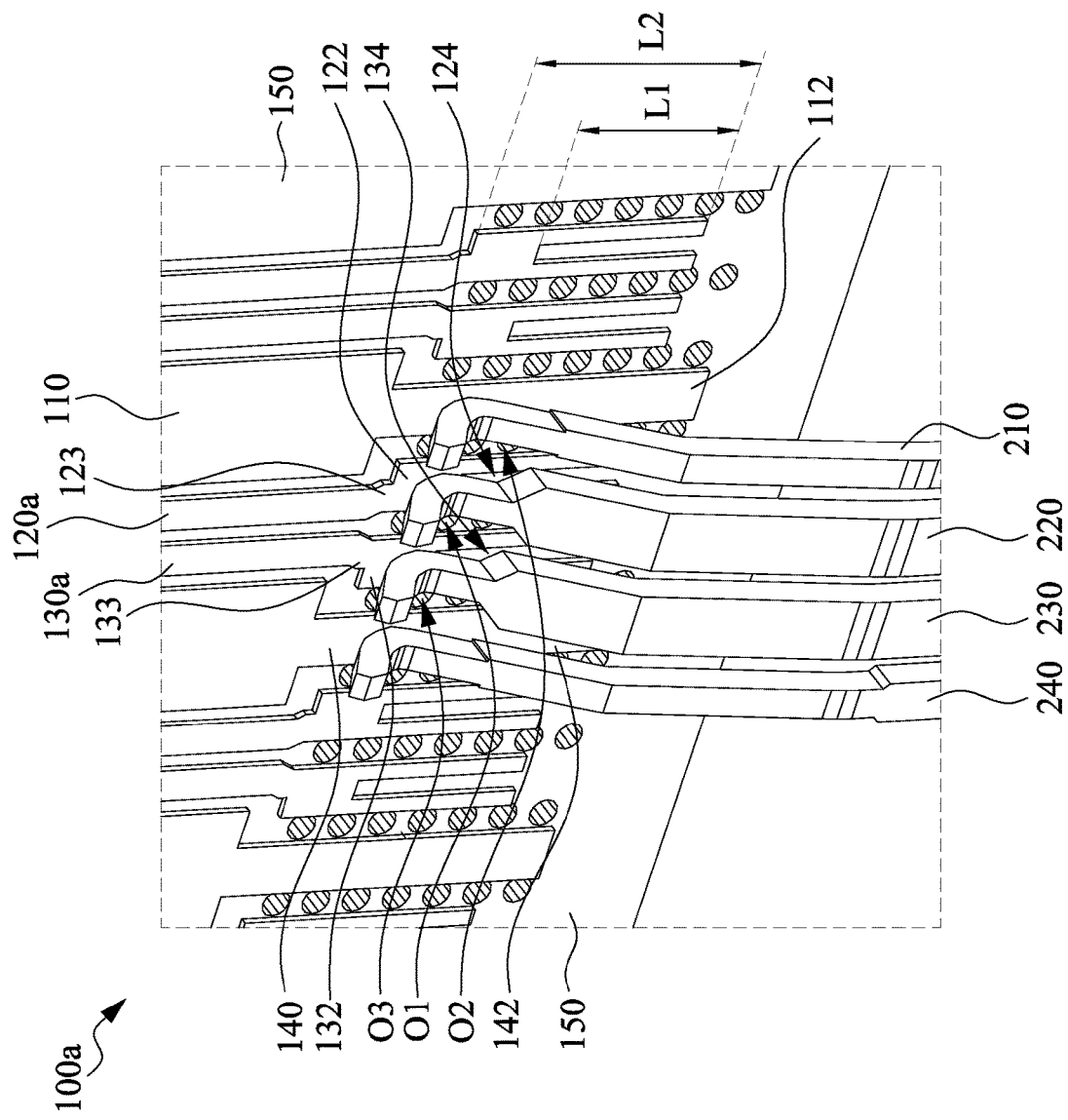
FIG. 8 is a partially enlarged view of a connector in electrical contact with the butt connector of FIG. 1 according to another embodiment of the present disclosure.
Figure 9:
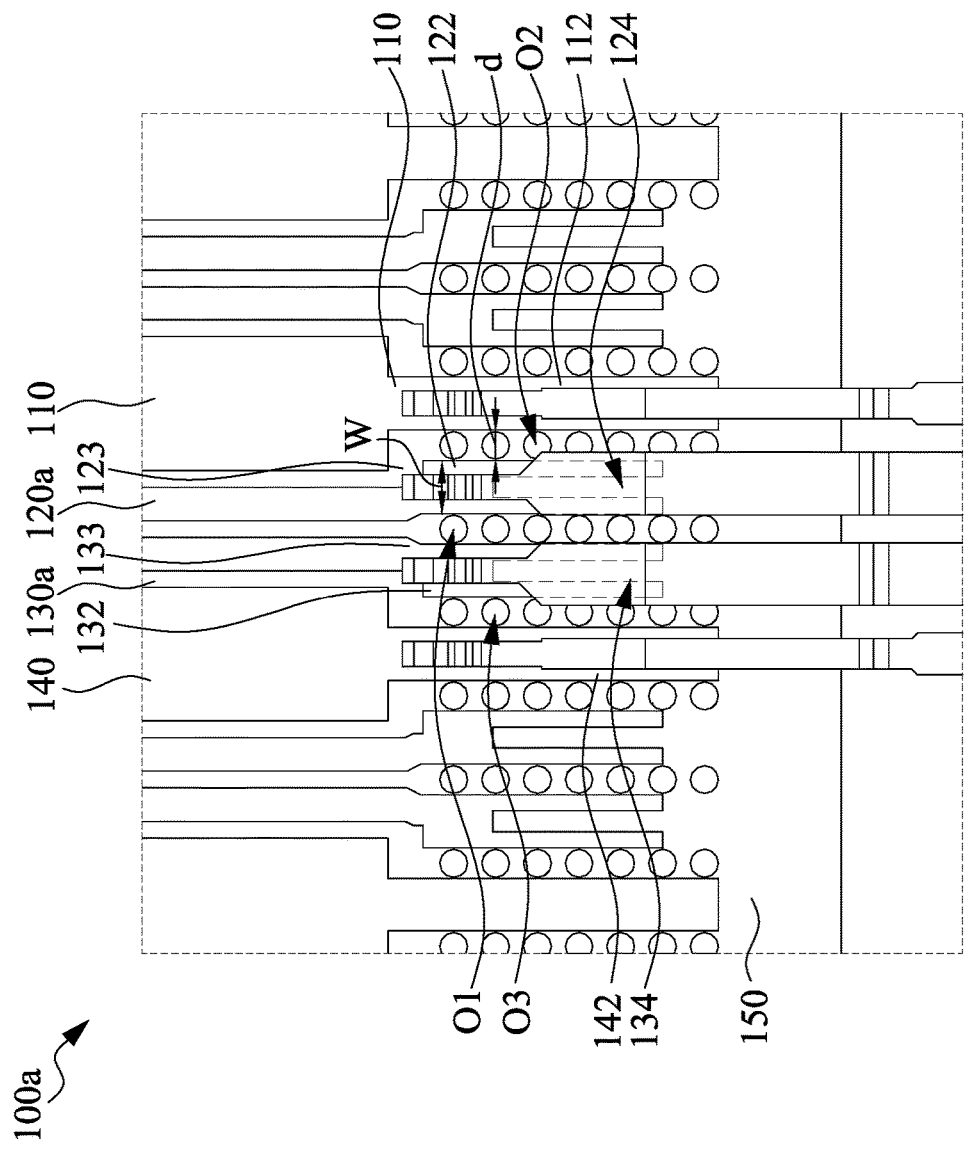
FIG. 9 is a side view of the connector in electrical contact with the butt connector shown in FIG. 8.

FIG. 8 is a partially enlarged view of a connector 100a in electrical contact with the butt connector 200 of FIG. 1 according to another embodiment of the present disclosure. FIG. 9 is a side view of the connector 100a in electrical contact with the butt connector 200 shown in FIG. 8. As shown in FIG. 8 and FIG. 9, the connector 100a includes the first grounding terminal 110, a first signal terminal 120a, a second signal terminal 130a, the second grounding terminal 140, and the substrate 150. The difference between this embodiment and the embodiment of FIG. 2 and FIG. 3 is that the first signal terminal 120a of the connector 100a includes an open groove 124, and the second signal terminal 130a includes an open groove 134. The open grooves 124 and 134 may be slender rectangles with the same width, and the open grooves 124 and 134 respectively extend from an end of the first signal terminal 120a and an end of the second signal terminal 130a to the contact areas 122 and 132, such that the first and second signal terminals 120a and 130a present a Y shape (or a fork shape). Taking the first signal terminal 120a as an example, the open groove 124 divides the first signal terminal 120a into two branches, and the two branches are connected by the contact area 122.

That is, due to the open grooves 124 and 134, an end of each of the first and second signal terminals 120a and 130a forms a single opening. Moreover, the widths of the open grooves 124 and 134 are substantially the same. When the width of the open grooves 124 and 134 is 25% to 99% of the maximum width W of the contact areas 122 and 132, the effect of reducing impedance is more obvious. The wider the open grooves 124 and 134, the better the effect of reducing impedance.

The open groove 124 of the first signal terminal 120a is through the two opposite surfaces of the first signal terminal 120a, and the open groove 134 of the second signal terminal 130a is through the two opposite surfaces of the second signal terminal 130a to expose the substrate, such that the substrate 150 can be exposed through the open grooves 124 and 134. In addition, positions of the substrate 150 overlapping any one of the open grooves 124 and 134 have no through hole. In other words, the substrate 150 below the open grooves 124 and 134 has no through hole. In some embodiments, a length L1 of the open groove 124 of the first signal terminal 120a is about 25% to 99% of a length L2 of the contact area 122 of the first signal terminal 120a. In this embodiment, the length of the open groove 134 of the second signal terminal 130a is substantially the same as the length of the open groove 124 of the first signal terminal 120a (both are the length L1), and the length of the contact area 132 of the second signal terminal 130a is substantially the same as the length of the contact area 122 of the first signal terminal 120a (both are the length L2). The length L2 of the contact area 122 (or 132) is calculated from the branches of the bottom portion of the open groove 124 (or 134) to the neck position of the turning area 123 (or 133).

Figure 10:
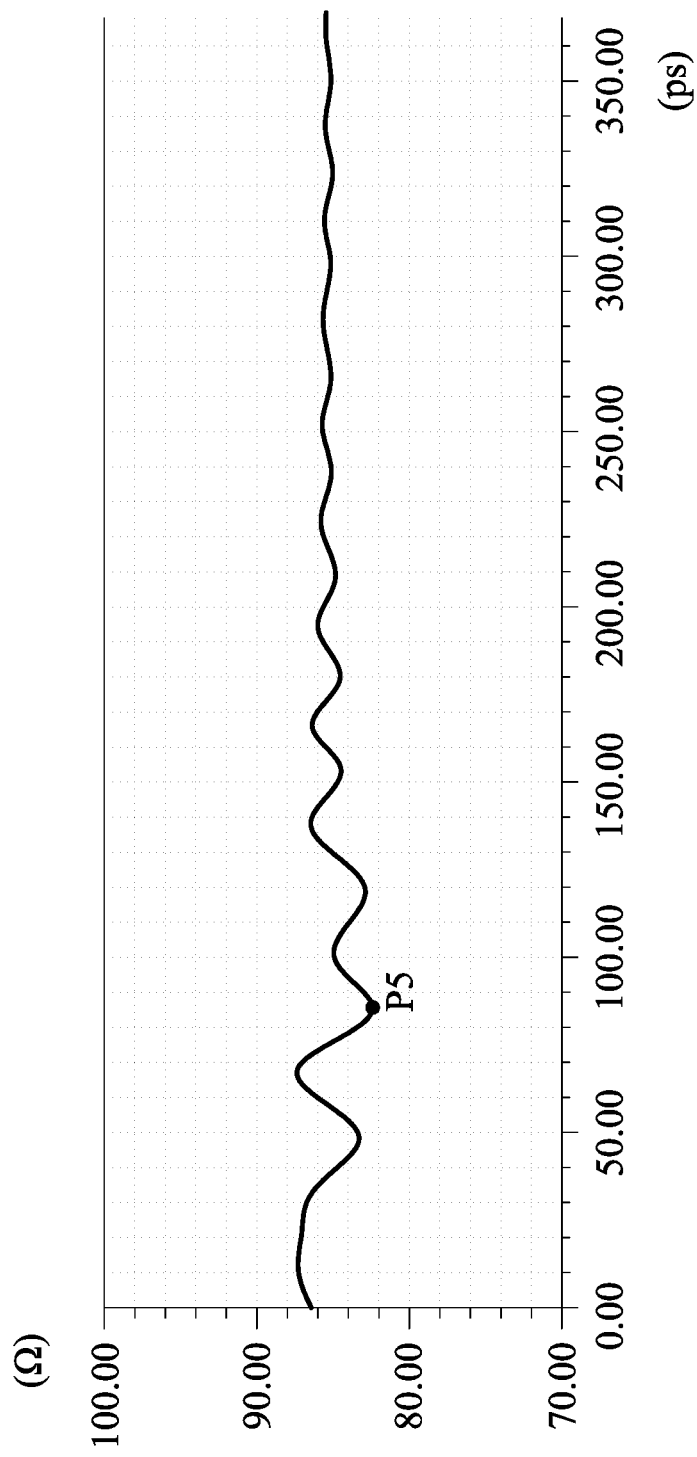
FIG. 10 is an impedance-time graph of measuring the connector of FIG. 9.

FIG. 10 is an impedance-time graph of measuring the connector 100a of FIG. 9. As shown in FIG. 10 and FIG. 5, the low impedance point (i.e., a data point P5) of the contact area (e.g., the contact area 122 of the first signal terminal 120a of FIG. 9) of the connector 100a (see FIG. 9) having the through holes O1, O2, and O3 and the open grooves 124 and 134 is about 82Ω, while the low impedance point (i.e., the data point P2) of the traditional connector is about 76Ω. Accordingly, the connector 100a can further increase the characteristic impedance of the contact area, which is beneficial for the quality of signal transmission.

Figure 11:
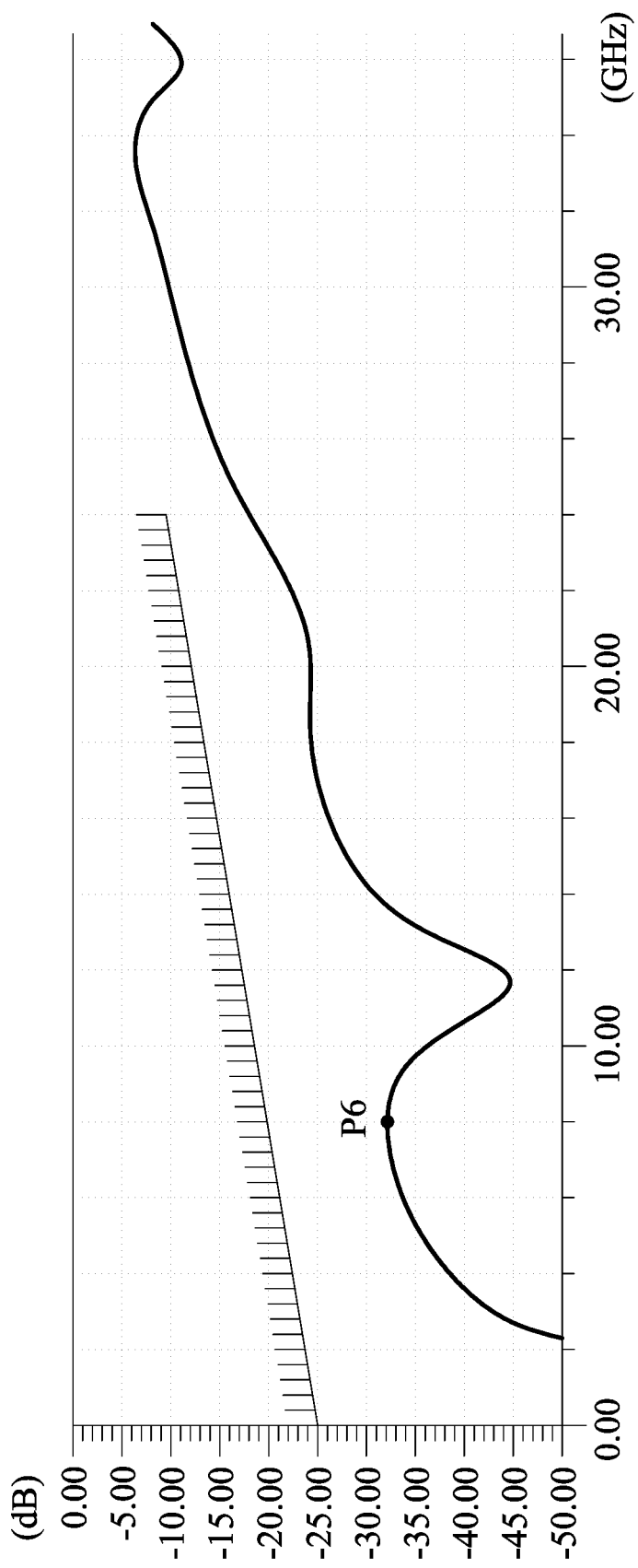
FIG. 11 is a reflection loss-frequency graph of measuring the connector of FIG. 9.

FIG. 11 is a reflection loss-frequency (dB) graph of measuring the connector 100a of FIG. 9. As shown in FIG. 11 and FIG. 7, the high reflection loss (dB) point (i.e., a data point P6) of the contact area (e.g., the contact area 122 of the first signal terminal 120a of FIG. 9) of the connector 100a (see FIG. 9) having the through holes O1, O2, and O3 and the open grooves 124 and 134 is about −33 dB, while the high reflection loss (dB) point (i.e., the data point P4) of traditional connector is about −26 dB. Accordingly, the connector 100a can further decrease reflection, which is beneficial for the quality of signal transmission.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A connector, comprising:
 a first grounding terminal, a first signal terminal, a second signal terminal, and a second grounding terminal, wherein the first grounding terminal, the first signal terminal, the second signal terminal, and the second grounding terminal are arranged in sequence, and each of the first grounding terminal, the first signal terminal, the second grounding terminal, and the second signal terminal has a contact area; and
 a substrate, wherein the first grounding terminal, the first signal terminal, the second signal terminal, and the second grounding terminal are sequentially disposed on the substrate and are parallel to each other, and the substrate has a plurality of through holes disposed between the first signal terminal and the second signal terminal, and the through holes are arranged in a line and extend beyond an end of each of the first signal terminal and the second signal termina.

2. The connector of claim 1, wherein the through holes are disposed between the contact area of the first signal terminal and the contact area of the second signal terminal.

3. The connector of claim 2, wherein the first signal terminal comprises an open groove through the first signal terminal to expose the substrate.

4. The connector of claim 3, wherein the open groove extends from the end of the first signal terminal to the contact area, such the first signal terminal presents a fork shape.

5. The connector of claim 4, wherein the connector is a wire end connector, and another end of the first signal terminal and another end of the second signal terminal are welded with a cable.

6. The connector of claim 3, wherein a width of the open groove of the first signal terminal is 25% to 99% of the maximum width of the contact area of the first signal terminal.

7. The connector of claim 3, wherein a position of the substrate overlapping the open groove has no through hole.

8. A connector, comprising:
 a first grounding terminal, a first signal terminal, a second signal terminal, and a second grounding terminal, wherein each of the first grounding terminal, the first signal terminal, the second signal terminal, and the second grounding terminal has a contact area; and
 a substrate, wherein the first grounding terminal, the first signal terminal, the second signal terminal, and the second grounding terminal are sequentially disposed on the substrate and are parallel to each other, and the substrate has a plurality of through holes disposed between the first signal terminal and the first grounding terminal, and the through holes are arranged in a line and extend beyond an end of the first signal terminal.

9. The connector of claim 8, wherein the through holes of the substrate are disposed between the contact area of the first signal terminal and the contact area of the first grounding terminal.

10. The connector of claim 9, wherein the substrate not only has the through holes disposed between the first signal terminal and the first grounding terminal, but also has a plurality of through holes disposed between the first signal terminal and the second signal terminal and between the second signal terminal and the second grounding terminal, such that all of the through holes are arranged in three columns.

11. The connector of claim 9, wherein the first signal terminal comprises an open groove through the first signal terminal to expose the substrate.

12. The connector of claim 11, wherein the open groove extends from the end of the first signal terminal to the contact area, such the first signal terminal presents a fork shape.

13. The connector of claim 12, wherein the connector is a wire end connector, and another end of the first signal terminal and an end of the second signal terminal are welded with a cable.

14. The connector of claim 11, wherein a width of the open groove of the first signal terminal is 25% to 99% of the maximum width of the contact area of the first signal terminal.

15. The connector of claim 11, wherein a position of the substrate overlapping the open groove has no through hole.

* * * * *